(12) United States Patent
Sato et al.

(10) Patent No.: US 7,837,398 B2
(45) Date of Patent: Nov. 23, 2010

(54) OPTICAL MODULE HAVING A BLOCK WITH FEEDTHROUGH PINS

(75) Inventors: Shunsuke Sato, Yokohama (JP); Naoki Nishiyama, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 281 days.

(21) Appl. No.: 11/984,334

(22) Filed: Nov. 15, 2007

(65) Prior Publication Data

US 2009/0067469 A1    Mar. 12, 2009

(30) Foreign Application Priority Data

Nov. 15, 2006    (JP)    ............... 2006-308582

(51) Int. Cl.
*G02B 6/36* (2006.01)
(52) U.S. Cl. ........................................ 385/92
(58) Field of Classification Search ............. None
See application file for complete search history.

(56) References Cited

U.S. PATENT DOCUMENTS

| | | | |
|---|---|---|---|
| 6,868,104 B2 * | 3/2005 | Stewart et al. ............. 372/36 |
| 6,948,865 B2 * | 9/2005 | Kuhara ..................... 385/93 |
| 7,011,458 B2 * | 3/2006 | Kagaya et al. ............. 385/92 |
| 7,026,655 B2 | 4/2006 | Go et al. | |
| 7,037,001 B2 | 5/2006 | Oomori | |
| 7,217,958 B2 * | 5/2007 | Aruga et al. ............... 257/98 |
| 7,218,657 B2 | 5/2007 | Kihara et al. | |
| 7,303,337 B2 * | 12/2007 | Fujimoto et al. .......... 385/88 |
| 2004/0228586 A1 * | 11/2004 | Kuhara ..................... 385/92 |

FOREIGN PATENT DOCUMENTS

JP    2005-064483 A    3/2005

* cited by examiner

*Primary Examiner*—Sung H Pak
(74) *Attorney, Agent, or Firm*—Venable LLP; Michael A. Sartori; Steven J. Schwarz

(57) ABSTRACT

The present invention provides an optical module with a relatively wider mounting area for the devices with a CAN package. The optical module of the present invention provides the stem and the cap, both of which form a cavity where the devices are to be installed. The stem provides the block extruding from the primary surface of the stem into the cavity. The block mounts the optical and electrical devices in surfaces opposite to each other, and provides feedthrough pins between these two surfaces. The device mounted in each surface may be electrically connected through these feedthrough pins.

12 Claims, 3 Drawing Sheets

OPTICAL MODULE HAVING A BLOCK WITH FEEDTHROUGH PINS

BACKGROUND OF THE INVENTION

1. Field of the Invention

The present invention relates to an optical module, in particular, the invention relates to a transmitting optical module applied in the optical communication system.

2. Related Prior Art

The transmitting optical module generally installs a semiconductor laser diode that converts an electrical signal into a corresponding optical signal. In particular, a small-sized transmitting module typically provides a CAN-type package to install the laser diode (hereafter denoted as LD). Various prior patents have disclosed such optical module with the CAN-type package.

For instance, an U.S. Pat. No. 7,026,655 has disclosed an optical module with an LD and a transistor to drive the LD both of which are mounted on the base provided in a stem that constitutes the CAN-type package. This optical module installs the LD and the driving transistor within the package, which makes it possible to mount the transistor immediate to the LD and to lower the parasitic impedance between the LD and the transistor to suppress the signal degradation.

Another U.S. Pat. No. 7,218,657, has disclosed a type of an optical module with the CAN-type package in which the stem installs the LD and the temperature sensor thereon. This optical module, because of the LD and the sensor on the stem, has made it possible to control the driving current for the LD precisely without being affected from an ambient temperature. In these modules, the stem has provided a block extruding from the primary surface thereof, and the block has mounted the LD thereon.

Still another U.S. Pat. No. 7,037,001, has disclosed a type of an optical transmitting module that provides auxiliary members to extend the lead pins behind the block to a front side of the block. The auxiliary members are fixed to the tip of the lead pins in one end wire-bonded to the device on the block in the other end. The auxiliary member detours the block so as not to come in contact with the block.

Small-sized optical module has been continuously requested. The module with the CAN-type package provides the block to mount the optical device, and this block provides a surface as the mounting area for the device only in one side thereof facing the center portion of the stem. That is, the conventional block has a D-shape cross section with a flat side surface facing the center portion to mount the device thereon. Accordingly, the conventional module is hard to mount electronic devices with large die area, or to miniaturize the package.

The block with a rectangular cross section may provide mounting areas in both side surfaces, one of which faces the center portion of the stem, while, the other faces an outside of the module. However, devices mounted on both side surfaces are hard to be electrically connected with each other. To provide an auxiliary member such as those disclosed in the U.S. Pat. No. 7,037,001 may be a solution for this subject, but it may cause to degrade the reliability in mechanical and electrical to apply the auxiliary member.

The present invention is to provide a new solution for the above subjects, that is, to enhance the flexibility of the device mounting and to enable the electrical connection between devices mounted on respective sides of the block.

SUMMARY OF THE INVENTION

The optical module of the present invention has a CAN package comprised of a stem and a cap. The stem and the cap form a cavity where the optical and electrical devices are enclosed. The stem includes a block and the stem base. The block extrudes from the stem base into the cavity and has a first surface, a second surface opposite to each other and a feedthrough pins. The first surface faces a center portion of the stem, while, the second surface faces a peripheral of the stem. The first surface mounts the optical device thereon, while the second surface mounts the electrical device.

In the present invention, the feedthrough pins in the block may electrically connect the optical device on the first surface with the electrical device on the second surface. Thus, the optical module of the invention may expand the area for mounting the optical and electrical devices within the cavity. Moreover, these optical and electrical devices may be electrically connected to each other without introducing any auxiliary member.

The first surface of the block may mount a driver for the optical device, in addition to the optical device, immediate to the optical device, which enhances the high frequency performance of the module because of the adjacent positioning between the optical device and the driver. The second surface of the block may mount a temperature sensor, in addition to the electrical device, to sense a temperature of the optical device on the first surface.

The stem base of the module may support a plurality of lead pins through which a driving signal and an electrical power may be provided to the optical device. In the present module, at least one of lead pins may be located behind the block, with respect to the center portion of the stem, namely, a side where the second surface faces. At leas one of lead pins may be wire-bonded to one of feedthrough pins to electrically connect this lead pins with the optical device.

The feedthrough pins pass through the block and are electrically isolated from the block by filling a gap between the block and the feedthrough pin with a sealant. This sealant may be made of poly-ether-ether-ketone, or epoxy resin. The stem base may be made of steel plate rolled-cold or Kovar. The block may be made of copper alloy.

BRIEF DESCRIPTION OF DRAWINGS

FIG. 3A shows the first surface of the stem with the devices mounted thereon, while.

DESCRIPTION OF PREFERRED EMBODIMENTS

The optical module according to the present invention provides an optical to electrical converting device or an electrical to optical converting device, and is called as a transmitter optical assembly or a receiver optical assembly depending on the device installed therein. Next exemplarily describes the transmitter optical assembly that installs a semiconductor laser diode (hereafter denoted as LD) as referring to FIGS. 1 to 3.

Figure 1A:
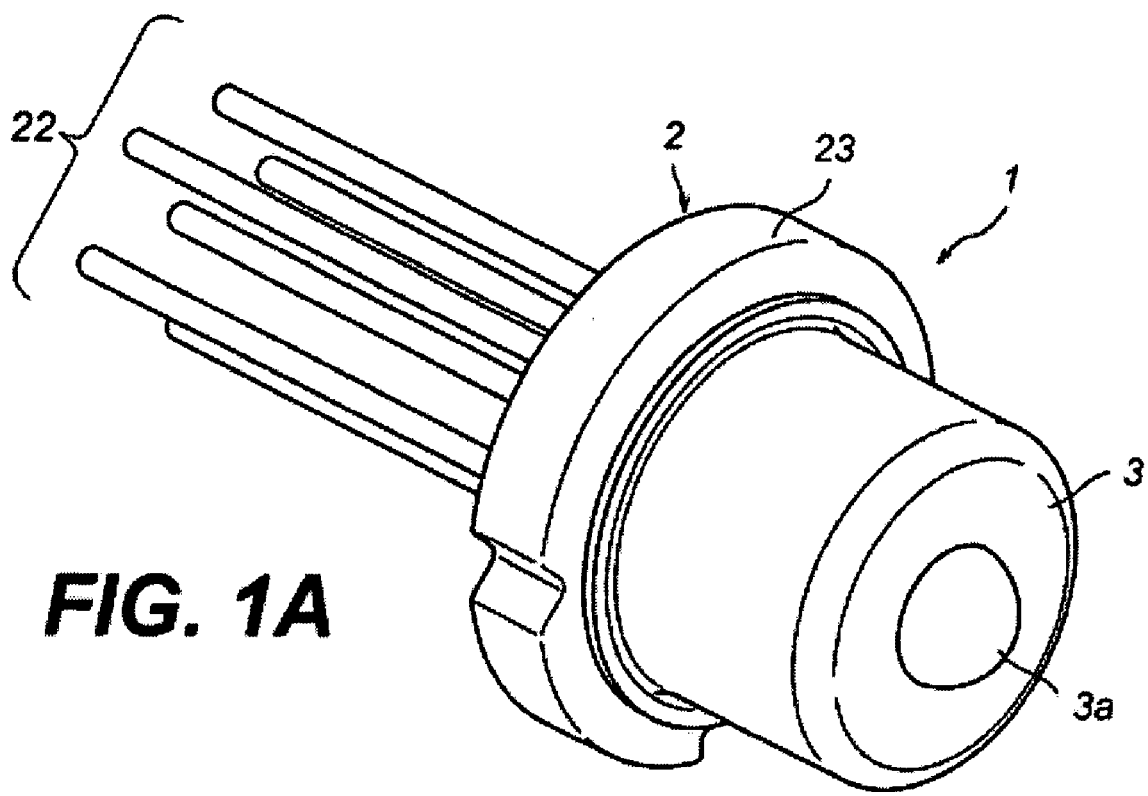
FIG. 1A is a perspective appearance of the optical module according to an embodiment of the present invention.
Figure 1B:
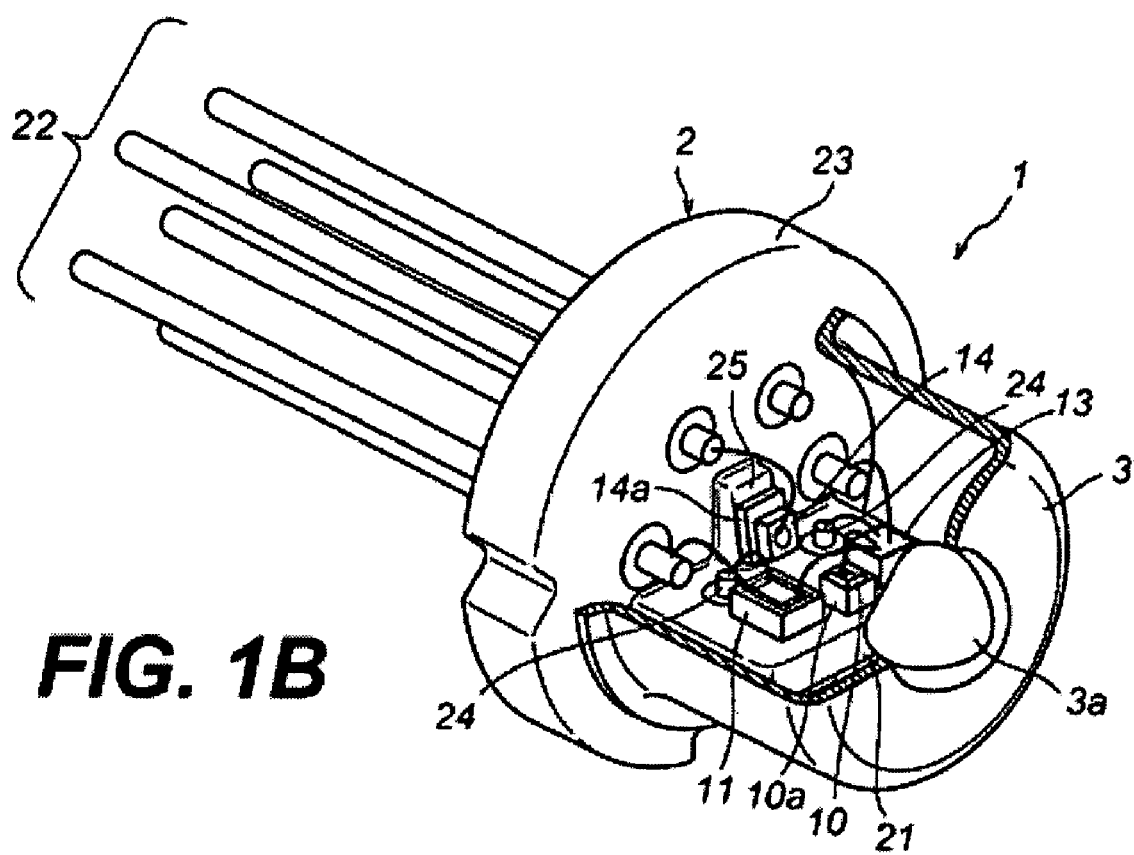
FIG. 1B is a perspective view of the module that is partially cut to show the inside of the module.
Figure 2A:
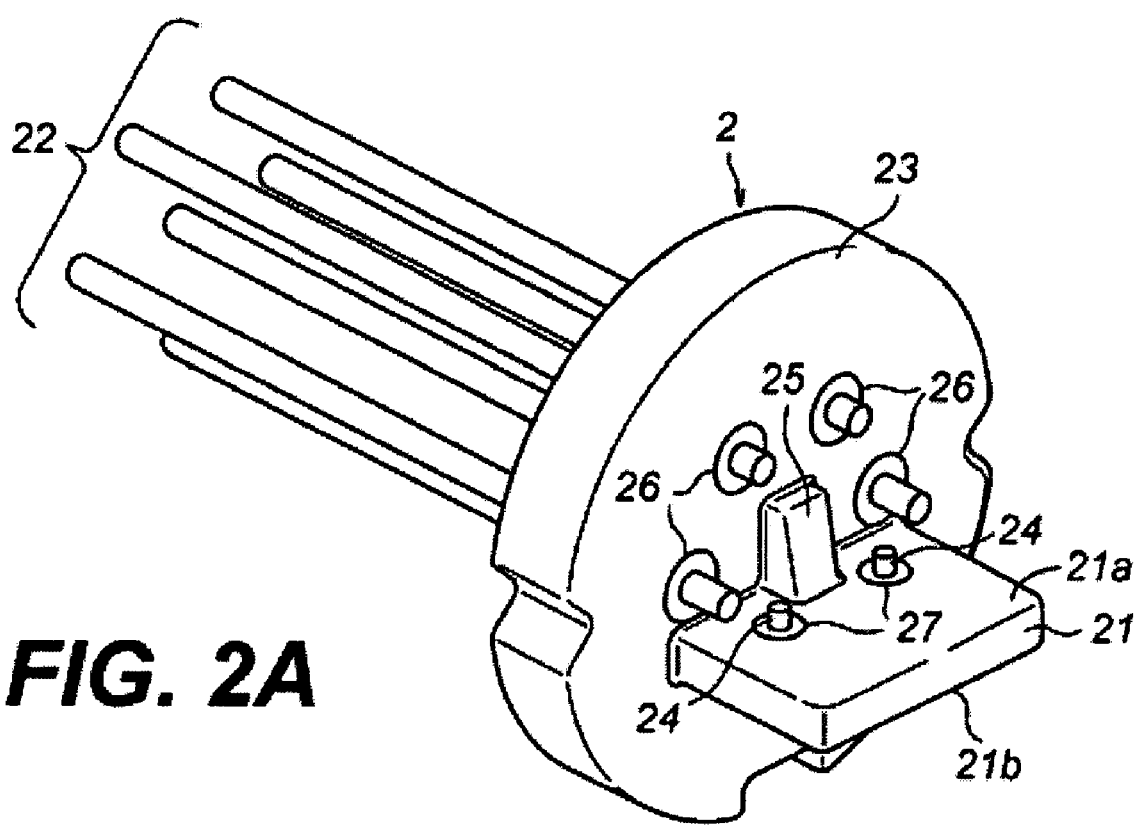
FIG. 2A shows the stem of the optical module without any device to be mounted.
Figure 2B:
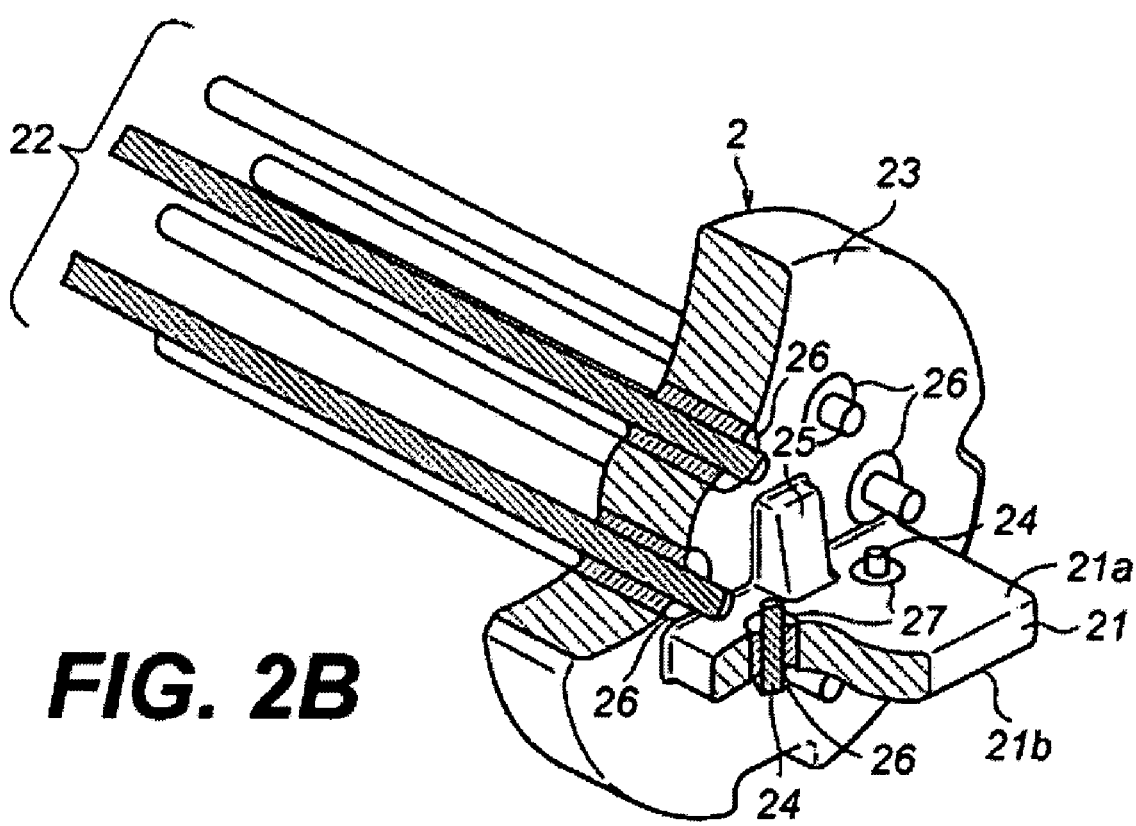
FIG. 2B shows the stem that is partially cut in the stem base to show the structure between the lead pin and the stem base.
Figure 3A:
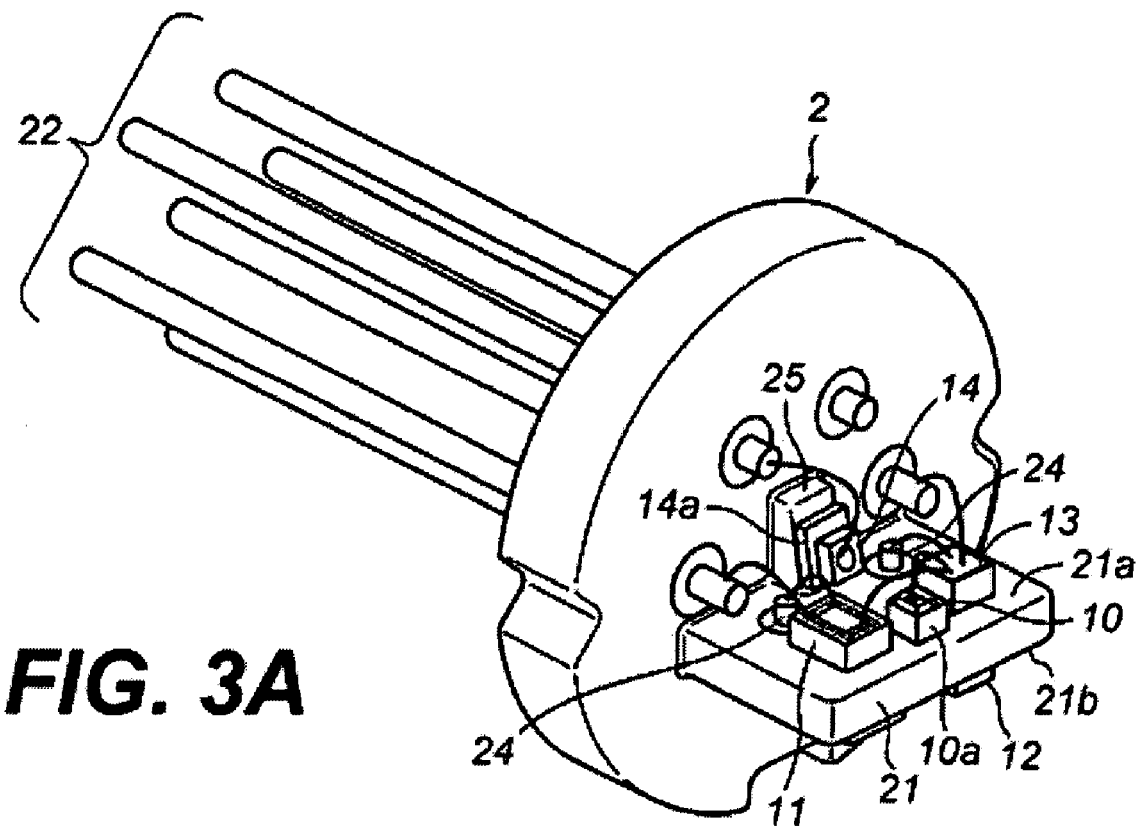
Figure 3B:
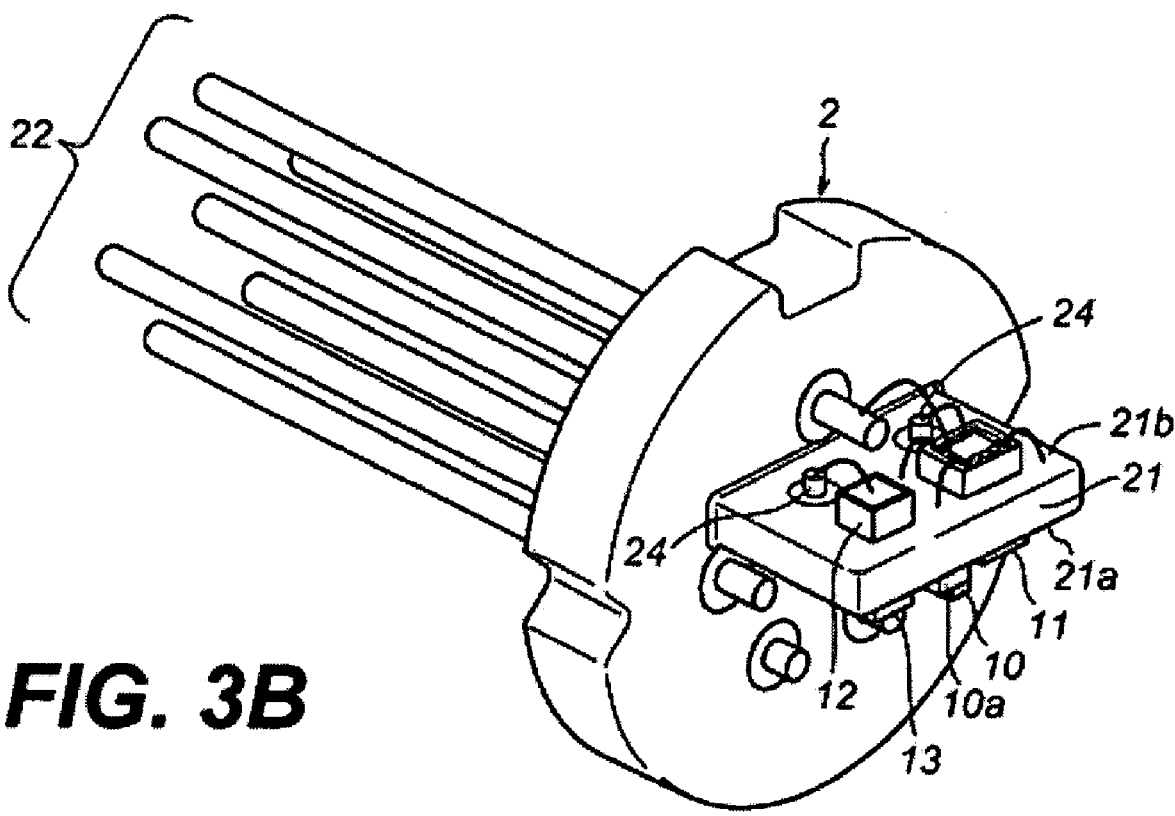
FIG. 3B shows the second surface of the stem also with the devices mounted thereof.

FIG. 1 typically shows an optical module of the invention, specifically, FIG. 1A shows an appearance of the optical module, FIG. 1B shows an inside of the module by partially cutting a package thereof. FIG. 2 is perspective views of a stem of the optical module, specifically, FIG. 2A shows an appearance of the stem, while, FIG. 2B partially cuts the stem. FIG. 3 shows an inside of the optical module that installs devices therein, specifically, FIG. 3A shows a first surface of a block that extrudes from the primary surface of the stem and mounts the devices thereon, while, FIG. 3B shows a second surface opposite to the first surface that also mounts devices thereon.

The optical module 1 of the present invention, as exemplarily shown in FIG. 1, has a CAN package comprising the stem 2 and the cap 3, both of which form a cavity where the LD 10 is enclosed. The module emits light from the LD 10 through the lens 3a mounted in the cap 3. The stem 2, made of material with good thermal conductivity, includes the block 21, the lead pins 22, and the stem base 23. The stem base 23 supports the leadpins 22. The module 1 may communicate with an electronic circuit outside of the module 1 through the lead pins 22.

The stem base 23 provides through holes 26 where the lead pins 22 pass through and a slant surface 25 that mounts the photodiode (hereafter denoted as PD) thereon. The block 21, which extrudes from the stem base 23 into the cavity, has a substantially rectangular cross section in parallel to the stem base 23. Thus, the block 21 provides first 21a and second 21b surfaces opposite to each other and mounts the LD 10 and/or electronic devices described later. The first surface 21a of the block 21 mounts the LD 10 and positions in a center of the stem 2, while, the second surface 21b positions outside of the first surface 21a.

The block 21 provides feedthrough pins 24 extending from the first surface 21a to the second surface 21b and being electrically isolated from the block 21. The feedthrough pins 24 pass respective through holes 27 in the block 21 and between the feedthrough pins 24 and the stem base 23 are filled with sealant to electrically isolate the feedthrough pins from the stem 2. These feedthrough pints 24 enable to connect the electronic devices mounted on the second surface 21b with the devices mounted on the first surface 21a with bonding wires. Specifically, wiring from the device mounted on the second surface 21b to the feedthrough pin 24 first and another wiring at the side of the first surface from this feedthrough pin to the device on the first surface 21a, the electrical connection between two devices may be realized.

Thus, the feedthrough pins 24 provided in the block 21 make it possible to electrically connect devices mounted on the first surface 21a with the devices on the second surface 21b, which enhances not only the flexibility in the assembly of the devices without any specific parts but also an area where the devices may be mounted. The CAN package has a restricted area or cavity where the optical and electrical devices may be installed, accordingly, to connect the devices mounted on the first 21a and second 21b surfaces of the block 21 with the feedthrough pins 24 may realize an optical module with relatively enhanced function with a small sized CAN package.

Next will specifically describe the optical module with the feedthrough pins according to the present invention as referring to FIGS. 1 and 3. As shown in FIGS. 1A and 3A, the first surface 21a mounts the LD 10 through the sub-mount 10a. An emitting point of the LD 10 does not always positions in the center of the stem 2. To set an offset between the center of the stem 2 and the emission point of the LD 10 occasionally enhances the optical coupling efficiency of the LD 10 with the lens 3a, or reduces the influence of the backward light returning the LD 10 reflected by the surface of the lens 3a or the surface of the tip end of the optical fiber. The sub-mount 10a may be made of material with good thermal conductivity, typically, aluminum nitride with wiring patterns on the surface thereof. The good thermal conductivity of the sub-mount 10 may enhance the heat dissipating effect from the LD 10 to the stem 2.

The second surface 21b may install a temperature sensor 12 to monitor a temperature of the LD 10. Because the LD 10 typically shows a large temperature dependence in characteristics thereof, to adjust the driving parameters depending on the temperatures of the LD 10 may enhance the performance of the module 1. It has been hard in conventional modules with the CAN package to install a temperature sensor within the package because of their restricted mounting area of the devices. The present optical module, because the second surface 21b of the block 21 opposite to the surface 21a where the LD 10 mounts may be provided as an additional mounting are, may install the temperature sensor within the package. Moreover, because the second surface 21b is in opposite to the first surface 21a where the LD 10 mounts thereon, the temperature of the LD 10 may be precisely monitored. The optical module 1 outputs a signal corresponding to the temperature of the LD 10, and the LD driver provided in the outside of the module 1 may precisely adjust the driving condition of the LD 10 based on thus provided monitored signal.

The first surface 21a may mount a driver transistor 11 that drives the LD 10 based on a signal provided outside of the module 1. Because the driver transistor 11 may be mounted immediate to the LD 10 within the package, this arrangement of the LD 10 and the transistor 11 may not only enhance the high frequency performance of the module due to a shortened wire connecting them but also reduce an EMI (electro-magnetic interference) noise radiated from the optical module 1.

Other electronic components, such as capacitors 13 and inductors (not shown in figures) may be mounted on not only the first surface 21a but the second surface 21b because of the feedthrough pins electrically connecting surfaces, 21a and 21b. The slant surface 25, as described previously, mounts the PD 14 by interposing another sub-mount 14a. The wire-bonding may carry out electrical connections between devices. Two steps wiring is carried out as follows: the first wiring connects the devices mounted on the first surface 21a to the corresponding feedthrough pin 24, and the second wiring connects this feedthrough pin 24 in the side of the second surface 21b to the device on the second surface 21b after rotating the module 1 so as to face up the second surface 21b.

Completing the wirings, the manufacturing process welds the cap 3 with the lens 3a to the stem 2 in an inert atmospheric filled with nitrogen, which hermetically seals the devices within the cavity. The optical module shown in FIG. 1A may further provide components for the optical coupling of the LD 10 with the external optical fiber. The components may include a stub with a coupling fiber and a sleeve for guiding a ferrule attached in an end portion of the optical fiber.

Thus, the aforementioned optical module 1 may install devices, such as resistor, capacitor and inductor, in addition to the optical device of the LD and the PD within the CAN package because the block provides the feedthrough pins that may electrically connect the surfaces opposite to each other, which enhances the mounting area for the devices compared to a conventional module whose block has a D-shape cross section and provides only one surface as the mounting area for the devices.

Next will describe the structure of the stem, in particular, the structure of the block will be described as referring to FIG. 2. As shown above, the stem 2 provides the stem base 23 and the block 21. The stem base 23 supports the lead pins 22 that pass through the corresponding through holes 26 and has the slant surface 25 to mount the PD. The block 21, that provides first 21a and second 21b surfaces opposite to each other, both of which mount the optical and electrical devices. These devices are electrically connected with feedthrough pins 24 that pass through the corresponding through holes 27.

The stem base 23 supports the lead pins 22 by filling a gap between the lead pins 22 and the stem base 23 with a sealant such as sealant glass with a low melting point to hermetically seal the cavity. To fix the cap 3 with the lens 3a by the resistance welding or the like to the stem base 23 after the installing the optical and electrical devices and wiring between them may hermetically seal the cavity, which enhances the reliability of the devices.

The block may support the feedthrough pins 24 with the similar method, that is, the sealant such as low melting glass may fill the gap between the block 21 and the feedthrough pins 24. However, this gap between the feedthrough pins 24 and the block 21 does not affect the hermitical seal of the cavity; accordingly, the sealant material may be flexible in its selection. Specifically, Poly-Ether-Ether-Ketone (PEEK) and epoxy glass may be applicable for the sealant. The PEEK is a resin material stable even in a temperature necessary to the die-bonding of the devices on the block 21.

The stem 2, the lead pins 22 and the feedthrough pins 24 may be made of ferrous material such as SPC (steel plate cold-rolled) or Kovar, an alloy of iron, nickel and cobalt. The ferrous material forms the compression seal due to the difference in the liner expansion co-efficient between the glass and the metal, while, the Kovar realizes the matched seal due to the comparable linear expansion co-efficient of the glass and that of the metal.

Specifically, the combination of the SPC and the soda-barium glass realizes the compression seal with the linear expansion co-efficient of materials of 13 ppm/K and 7.6 ppm/K, respectively. While, the combination of the Kovar and the borosilicate glass shows the matched seal with the linear expansion co-efficient of 5.4 ppm/K and 5.0 ppm/K, respectively. Because the sealant glass fills the gap at its melting point, the difference in the linear expansion between the sealant and the pins cases the stress therebetween at the room temperature. Thus, the compression seal, where the peripheral metal has a larger liner expansion co-efficient, generates the compressive stress such that the metal presses the pins.

The ferrous material is preferable for the stem to obtain the optical module with relative lower cost; while, the Kovar may be applicable for an optical module with the reliability at high temperatures. Moreover, the block 21 may be made of copper alloy, such as copper tungsten (CuW), with good thermal conductivity in place of the ferrous metal because the block mounts the devices that generate large heat. In this case, the stem base 23 fixes the block 21 by brazing or welding.

While the preferred embodiments of the present invention have been described in detail above, many changes and modifications to these embodiments may be made without departing from the true scope and teachings of the present invention. The present invention, therefore, is limited only as claimed below and the equivalents thereof.

We claim:
1. An optical module, comprising:
a stem and a cap, the stem and the cap constituting a CAN package with a cavity to install optical device and an electrical device therein,
wherein the stem provides a block and a stem base, the block extruding from the stem base into the cavity, the block having a first surface configured to mount the semiconductor optical device thereon, a second surface opposite to the first surface, and a plurality of feedthrough pins passing from the first surface to the second surface, the first surface facing a center portion of the stem and the second surface facing a peripheral of the stem,
wherein the stem further provides a plurality of lead pins, at least one of lead pins facing the second surface of the block, and
wherein the at least one of lead pins facing the second surface of the block is electrically connected with the electronic device, and the feedthrough pin electrically connects the optical device on the first surface to the at least one of lead pins facing the second surface.
2. The optical module according to claim 1,
wherein the first surface mounts, in addition to the optical device, an electrical device to drive the optical device and the second surface mounts, in addition to the electrical device on the second surface, a temperature sensor to sense a temperature of the optical device.
3. The optical module according to claim 1,
wherein at least one of lead pins facing the second surface of the block is wire-bonded to one of feedthrough pins.
4. The optical module according to claim 1,
wherein the plurality of feedthrough pins passes through the block and is electrically isolated from the block by filling a gap between the block and the feedthrough pin with a sealant.
5. The optical module according to claim 4,
wherein the sealant is made of poly-ether-ether-ketone, or epoxy glass.
6. The optical module according to claim 1,
wherein the stem base is made of SPC, or Kovar.
7. The optical module according to claim 6,
wherein the block is made of copper alloy.
8. An optical module with a CAN package, comprising:
a semiconductor optical device;
a disk-shaped stem including a stem base and a block, the block mounting the semiconductor optical device on a side surface thereon and having a feedthrough pin passing from the side surface through another side surface opposite to the side surface, the feedthrough pin being electrically isolated from the block;
a plurality of lead pins provided in the stem base, at least one of lead pins facing the other side surface of the block and electrically connected to the feedthrough pin provided in the block,
wherein the semiconductor optical device is provided with a driving signal from the at least one of lead pins through the feedthrough pin.
9. The optical module of claim 8,
further comprising an electronic circuit configured to provide the driving signal to the semiconductor optical device,
wherein the electronic circuit is mounted on the other side surface of the block and configured to receive an electrical signal from the at least one of lead pins and outputs the driving signal to the feedthrough pin.

10. The optical module of claim 8,
further comprising an electronic circuit configured to provide the driving signal to the semiconductor optical device,
wherein the electronic circuit is mounted on the side surface of the block and configured to receive an electrical signal from the at least one of lead pins through the feedthrough pin and outputs the driving signal to the semiconductor optical signal.

11. The optical module of claim 10,
wherein the semiconductor optical device is directly wire-bonded to the electronic circuit.

12. The optical module of claim 8,
further comprising a cap attached to the stem,
wherein the cap and the stem form a cavity where the semiconductor optical device is hermetically enclosed thereon.

* * * * *